(12) United States Patent
Johnson et al.

(10) Patent No.: US 6,487,127 B2
(45) Date of Patent: Nov. 26, 2002

(54) CIRCUIT CONFIGURATION FOR READING AND WRITING INFORMATION AT A MEMORY CELL FIELD

(75) Inventors: Bret Johnson, München (DE); Eckhard Plättner, München (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/906,451

(22) Filed: Jul. 16, 2001

(65) Prior Publication Data

US 2002/0015331 A1 Feb. 7, 2002

(30) Foreign Application Priority Data

Jul. 14, 2000 (DE) .......................................... 100 34 255

(51) Int. Cl.[7] .............................................. G11C 16/04
(52) U.S. Cl. .............. 365/189.05; 365/205; 365/189.01
(58) Field of Search ........................... 365/189.05, 205, 365/189.01

(56) References Cited

U.S. PATENT DOCUMENTS

| | | | | |
|---|---|---|---|---|
| 4,435,793 A | | 3/1984 | Ochii | ........................... 365/233 |
| 5,291,447 A | | 3/1994 | Kodama et al. | ............. 365/190 |
| 5,539,691 A | * | 7/1996 | Kozaru et al. | ......... 365/189.05 |
| 5,648,927 A | * | 7/1997 | Tran | .............................. 365/63 |
| 5,764,580 A | * | 6/1998 | Suzuki et al. | ................ 365/205 |
| 5,862,089 A | * | 1/1999 | Raad et al. | .................. 365/203 |
| 5,877,987 A | * | 3/1999 | Merritt | .................... 365/189.05 |
| 5,978,300 A | * | 11/1999 | Toda | ...................... 365/230.03 |
| 6,061,278 A | * | 5/2000 | Kato et al. | ................... 365/190 |
| 6,108,254 A | * | 8/2000 | Watanabe et al. | ............ 365/202 |

FOREIGN PATENT DOCUMENTS

WO        WO 85/02314        6/1985

* cited by examiner

*Primary Examiner*—Richard Elms
*Assistant Examiner*—Tuan T. Nguyen
(74) *Attorney, Agent, or Firm*—Laurence A. Greenberg; Werner H. Stemer; Gregory L. Mayback

(57) ABSTRACT

Binary information is written to and read from a memory cell field forming a matrix-type field of rows and columns via a plurality of write/read circuits, each having a latch flipflop with at least one data terminal connected on one side to an allocated column-related bit line and on the other side, by way of a gate circuit, to a data line. Access to the relevant bit line is accomplished via a column selection signal which controls the gate circuit. A switching device facilitates the writing process. After the excitation of any row-related word line, the switching device interrupts the current supply of the latch flipflops that are selected for an access starting no earlier than when the relevant latch flipflop assumes a state indicating the information content of the accessed memory cell and, at the latest, during the active interval of the relevant column selection signal.

6 Claims, 2 Drawing Sheets

CIRCUIT CONFIGURATION FOR READING AND WRITING INFORMATION AT A MEMORY CELL FIELD

BACKGROUND OF THE INVENTION

Field of the Invention

The invention lies in the memory technology field and is particularly suitable for dynamic RAM memories (DRAMs). DRAM technology, however, is not the exclusive field of application of the invention.

The invention relates to a circuit configuration for reading and writing binary information at a memory cell field forming a matrix-type arrangement of rows and columns of memory cells. Access to any memory cell is accomplished by the excitation of a word line which is allocated to the relevant row and the actuation of a bit line which is allocated to the relevant column. This driving is effected by a selectively allocated write/read circuit. Each write/read circuit contains a latch flipflop with at least one data terminal which is connected on one side to an allocated bit line and on the other side, by way of a gate circuit that is controllable by means of a column selection signal, to a data line.

In conventional memory matrices, access to any memory cell is accomplished by the excitation of a word line that is allocated to the relevant row and the actuation of a bit line that is allocated to the relevant column. The latter is accomplished by means of write/read circuits which transfer information bits from a message source to the bit lines in the write operation and from the bit lines to a message sink in the read operation. Since the charge states of the memory cells which describe the binary values 0 (zero) and 1 (one) of the stored information differ only by a small level difference, the write/read circuits must be designed to effectuate an amplification in the read operation, and for this reason these circuits are herein also referred to as "read amplifiers," as they are commonly known, even though they are also used in the write operation.

The standard read amplifiers in use today are built as what are known as latch flipflops, i.e. as transistorized bistable flipflops that are switchable between two defined extreme states representing the binary values 0 and 1. Each of these opposing states can be triggered by the build-up of a triggering voltage of one or the other polarity at a data terminal, whereby the circuit is driven in a self-perpetuating extreme state in which the data terminal is drawn to (or close to) one or the other potential of the supply voltage. The data terminal is thus locked at a binary value indicated by the polarity of the triggering voltage (the binary value is "latched"), and the relevant item of binary data can be handed over with sufficient power and endurance.

Customarily, the data terminal of the latch flipflop contained in the read amplifier is connected on one side to an allocated bit line and on the other side, by way of a gate circuit that can be controlled by a column selection signal, to the data line leading to the message source or message sink. In the case of paired differential bit lines where each bit line path forms a differential pair of two bit lines, and the data line path likewise forms a differential pair of two data lines, the latch flipflops are provided with two data terminals, as in the case of a differential amplifier, each of these terminals being connected on one side to an allocated instance of the bit lines forming the relevant pair and on the other side, by way of a respectively allocated gate circuit half, to an allocated instance of the two data lines.

For reading and writing at a memory cell, after the relevant word line is generated, at least the read amplifier which is responsible for the relevant column is activated, so that current for building up the trigger voltage flows at the data terminal of the latch flipflop by way of the relevant bit line in dependence upon the charge status of the cell, whereupon the flipflop assumes the binary state representing the information content of the cell. The potential of the data terminal is thereby drawn to the level indicating the information. The column selection signal is then applied in order to connect the data terminal to the data line by way of the gate circuit. In the read operation, the potential of the data terminal is taken over by the data line. In the write operation, the data line is impressed by the level for the write information from the outside, which naturally flips the latch flipflop by way of the data terminal if the binary state of the flipflop hitherto does not correspond to the write information (i.e. if the cell content must be modified).

The response sensitivity of the read amplifier in the read operation, i.e. its voltage/current amplification (transconductance), depends on the amplification of the transistors contained in the latch flipflop. The higher this amplification is, the faster and more reliably the latch flipflop can be flipped by the small current delivered by a selected memory cell from its unlatched initial state into one of the two stable binary states and latched in this state. Engineers therefore strive to construct the read amplifier optimally strong in order to achieve high read speeds. But it may turn out that the writing of the information from the data line path into the cell field is difficult or impossible. This is rooted in the abovementioned fact that in the write operation the latch flipflop may have to be flipped into another state, i.e. the read amplifier may have to be "rewritten". But when this is dimensioned for power, it becomes difficult or time-consuming to flip the latch flipflop from one assumed binary state into the other, especially since the gate circuit by way of which the write information runs from the data line into the latch flipflop limits current.

Hitherto, this problem, which is particularly severe in ultra-high-speed DRAMs, has been solved by dimensioning the write drivers that generate the write levels for ultra-high power. But when the read amplifiers are designed for greater and greater power, this technique becomes less and less expedient, since the drivers become ever larger and slower and consume ever greater amounts of current.

Another solution would be to utilize a separate write circuit in the read amplifier. But this would entail a substantial space outlay.

U.S. Pat. No. 4,435,793 describes a circuit configuration for reading binary information from a memory cell field containing a write/read circuit with a latch flipflop having a switching device for activating/deactivating the flipflop and an additional in-series switching device which is actuated by a column decoder.

SUMMARY OF THE INVENTION

The object of the present invention is to provide a circuit configuration for reading and writing binary information from and to a memory cell matrix which overcomes the above-noted deficiencies and disadvantages of the prior art devices and methods of this general kind, and which renders possible a perfect writing of information at a memory cell field given low circuitry and energy outlays and regardless of the read amplification.

With the above and other objects in view there is provided, in accordance with the invention, a circuit configuration for reading and writing binary information at a memory cell field arranged in a matrix of rows and columns of memory cells each connected to a word line allocated to a row and a bit line allocated to a column of the memory cells, comprising:

write/read circuits each connected to access a respective memory cell via a word line and a bit line;

each of the write/read circuits containing a gate circuit controllable by a column selection signal, and a latch flipflop having a current supply and at least one data terminal connected between an allocated bit line and a data line via the gate circuit;

a switching device connected to the current supply of the latch flipflops, the switching device, subsequently to an excitation of any word line, interrupting the current supply to the latch flipflops in the write/read circuits that are controllable by a column selection signal, from an instant no earlier than a time at which the respective latch flipflop assumes a state indicating an information content of the accessed memory cell and, at the latest, within an active interval of the relevant column selection signal.

In other words, the invention is based on a circuit configuration for reading and writing binary information at a memory cell field forming a matrix of rows and columns of memory cells. Access to any memory cell is accomplished by the excitation of a word line that is allocated to the relevant row and the actuation of a bit line that is allocated to the relevant column by means of respectively allocated write/read circuits. Each write/read circuit contains a latch flipflop having at least one data terminal which is connected on one side to an allocated bit line and on the other side, by way of a gate circuit that is controllable by a column selection signal, to a data line. The invention provides a switching device which, subsequent to the excitation of any word line, interrupts the current supply to the latch flipflop in the write/read circuits which are actuated by a column selection signal, from an instant which is no earlier than when the relevant latch flipflop assumes the state indicating the information content of the accessed memory cell and which, at the latest, falls within the active interval of the relevant column selection signal.

The invention thus contains a rather simple circuit measure which merely provides for a cutoff of the current supply to the latch flipflops that are to be selected for an access operation at a suitable instant after the latch flipflop has set itself to the binary state which is determined by the cell contents and before a write operation could potentially set in. This disconnection prevents the write process from having to fight the read amplification; the effort in the write operation is thus independent of the read amplification.

In accordance with an added feature of the invention, the switching device includes a switch in each of the write/read circuits, the cut-out switch interrupting a connection between a supply potential and the relevant latch flipflop. The inventively provided switching device advantageously contains a cut-out switch in each read/write circuit, which is provided for interrupting the connection between a supply potential and the relevant latch flipflop. Its realization requires only one additional element, for instance a field-effect transistor (FET), per bit line (that is to say per bit line pair in the event of paired bit lines). No other circuits are needed in the region of the write/read circuit, so that the space outlay is minimal. Given a suitable design of the cut-out switch, the column selection signal of the relevant write/read circuit can be used directly for its actuation, in order to initiate the interruption of the current supply at the beginning of this column selection signal and to maintain it for the duration of the column selection signal. The advantage of this is that no additional lines must be led into the write/read circuit.

In accordance with an additional feature of the invention, each switch responds to the column selection signal of the relevant write/read circuit so as to initiate the interruption of the current supply at a beginning of the column selection signal and to maintain the interruption for the duration of the column selection signal.

In accordance with another feature of the invention, each latch flipflop includes a first transistor pair with each transistor of the first transistor pair having a control electrode connected to a main electrode of the respective other transistor of the first transistor pair, one of the transistors of the transistor pair has a control electrode connected to a data terminal of the latch flipflop, and the other main electrodes of the two transistors are connected to a connection node for receiving a first supply potential, and wherein the switch is disposed between the connection node and a supply terminal carrying the first supply potential of the respective write/read circuit.

In accordance with a further feature of the invention, each of the data lines is shared by a plurality of the write/read circuits, and a latch circuit is connected to each data line, the latch circuit locks a binary state of the data terminal of a latch flipflop coupled onto the data line by the allocated gate circuit at the respective data line.

In accordance with a concomitant feature of the invention, the latch circuit comprises a transistor pair corresponding to the first transistor pair with respect to conductivity type and in which the control electrode of each transistor is connected to a main electrode of the respective other transistor, the control electrode of one of the transistors is connected to the shared data line, and the other main electrodes of the two transistors are connected to a supply terminal carrying the first supply potential.

In these specific developments of the invention, it can thus be ensured by additional latching circuit parts at the data line that no information is lost, even given relatively long interruptions of the current supply of the latch flipflop, such as occur when long column selection impulses are utilized. Yet, given the utilization of data lines which are each shared by a plurality of write/read circuits, these circuit parts are required at the periphery only once per data line.

Other features which are considered as characteristic for the invention are set forth in the appended claims.

Although the invention is illustrated and described herein as embodied in a circuit configuration for reading and writing information at a memory cell field, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figures 1, 2:
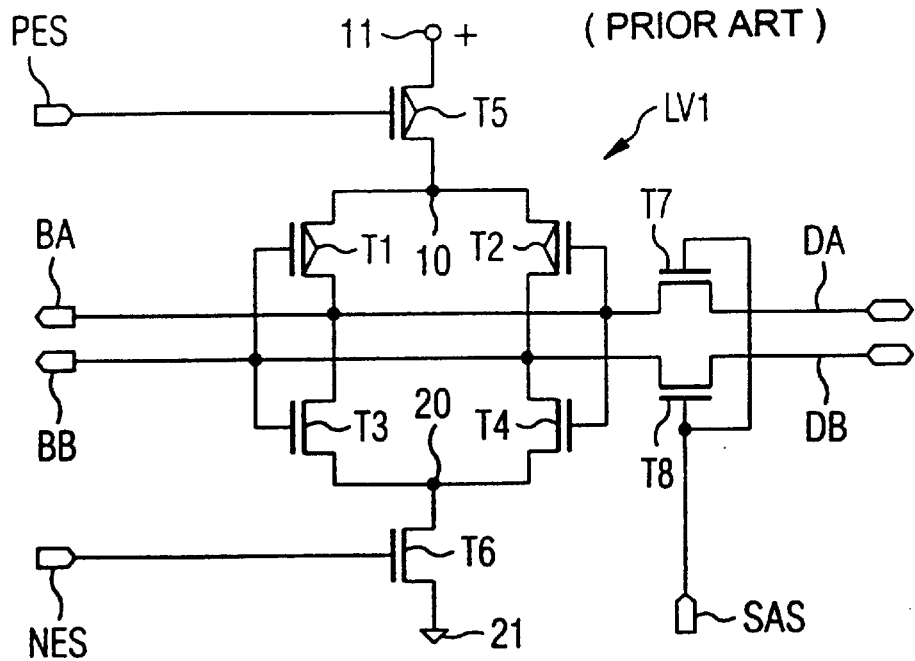
FIG. 1 is a circuit diagram of a prior art read amplifier.
FIG. 2 is a circuit diagram of a read amplifier according to one embodiment of the invention.

Referring now to the figures of the drawing in detail and first, particularly, to the prior art FIG. 1 thereof, there is seen a typical construction of a read amplifier.

The conventional read amplifier in FIG. 1 is referenced LV1 and overall contains a first transistor pair consisting of two p-channel field-effect transistors (P-FETs) T1 and T2 and a second transistor pair consisting of two n-channel field-effect transistors (N-FETs) T3 and T4. The first main electrodes of the P-FETs T1 and T2, in this case the source electrodes, are coupled together at a connection node 10, which is connected by way of the switched path of a first transistor switch T5 to a first current supply terminal 11. In this case, the terminal 11 receives the positive potential of a current supply source (which is not included in the figure). The source electrodes of the N-FETs T3 and T4 are coupled together at a connection node 20, which is connected by way of the switched path of a second transistor switch T6 to a second current supply terminal 21, which in this case receives the reference potential (e.g. ground potential) of the current supply source. In the present case, the first transistor switch T5 is a P-FET, and the second transistor switch T6 is an N-FET.

The second main electrodes of the transistors T1 and T3 (in this case the drain electrodes) and the gate electrodes of the transistors T2 and T4 are all connected to a first data terminal BA, which leads to one of the two bit lines of a differential bit line pair which is specifically allocated to the read amplifier LV1. Similarly, drain electrodes of the transistors T2 and T4 and the gate electrodes of the transistors T1 and T3 are all connected to a second data terminal BB, which leads to the other bit line of the differential pair. The two data terminals BA and BB are also connected by way of respective gate circuit transistors T7 and T8 (in this case N-FETs), to respectively allocated data lines DA and DB, which in the present embodiment form a differential bidirectional data line pair. The four transistors T1 to T4 form a latch flipflop, which can be triggered into one or the other stable (binary) state given an active voltage supply (i.e. when the two transistors T5 and T6 are conductive), in order to capture the binary information set at the data terminals BA and BB and to keep it, as hereinafter described.

In the present case of paired bit lines, each row of the memory field contains two cells per column position, one of which stores the "true" binary value and the other of which stores the "complementary" binary value. Each of these two cells is connected to a respectively allocated instance of the two bit lines of the pair belonging to the relevant column. With the excitation of a word line, the cell pairs of the relevant row is coupled to the respective bit line pair, so that a potential difference having a polarity that represents the stored information emerges between the two bit lines of the pair. This potential difference appears at the data terminals BA and BB of the read amplifier which is allocated to the relevant pair.

In operation, the read amplifier LV1 is activated shortly after the excitation of a word line in that the two transistor switches T5 and T6 are made conductive by respectively allocated activation signals PES and NES. The same process occurs at the same time with all other read amplifiers (not included in the figure) of the cell field which are connected to the other bit line pairs, whose structures correspond to that of the read amplifier LV1 in FIG. 1. If the potential difference at the data terminals is of such a polarity that BA is positive relative to BB, then the transistors T1 and T4 are driven in the direction of rising conductivity, and the transistors T2 and T3 are driven in the direction of increasing blocking, so that BA is drawn to the positive supply potential of the terminal 11, and BB is drawn to the reference potential prevailing at terminal 21. As a result of the positive feedback between T1 and T4 and between T2 and T3, that is to say the negative feedback between T1 and T2 and between T3 and T4, this process accelerates and leads to the latching of the final state. If, on the other hand, BA is negative relative to BB at the instant of the activation of the read amplifier, the opposite final state is achieved, with BA being drawn to the reference potential and BB to the positive supply potential. The "dispersed" potential difference between the data terminals BA, BB in the respective final states is written back to the relevant cell pair by way of the connected bit line pair, thereby refreshing its memory information. The activation signals PES and NES are retracted upon de-excitation of the word line.

The respective final state, i.e. one or the other stable binary state of the latch flipflop T1–T4, is achieved upon the expiration of what is known as the "evaluation interval," the length of which depends on the dimensioning of the read amplifier LV1, among other factors, and is shorter the higher the amplification of the amplifier is. At the end of this interval, if the read amplifier is to be selected for a write or read operation a column selection signal SAS is set at this amplifier, which renders the gate circuit transistors T7 and T8 conductive and thus couples the potential difference of the data terminals BA, BB, which has been "dispersed" by the latch flipflop T1–T4 as described, to the data lines DA, DB. The information which this represents can then be read at the data lines by a non-illustrated processing device. For the writing of an item of information, the potential difference corresponding to the write information is instead set at the data lines from outside during the column section pulse SAS, i.e. given an open gate circuit T7–T8. If this information is the same as the previous memory information, nothing changes in the switching state of the latch flipflop T1–T4. But if the new information is the opposite binary value (inverse potential difference), then the latch flipflop T1–T4 must be thrown into the other switch state.

In the prior read amplifier LV1 represented in FIG. 1, this throwing of the latch flipflop T1–T4 is relatively difficult, because of the need to work against the amplification of the active latch flipflop, and in fact over the naturally current limiting gate circuit T7–T8. According to the present invention, this problem is eliminated by taking precautions to temporarily interrupt the current supply of the latch flipflop during the time of a potentially executed write process. The exemplifying embodiment in FIG. 2 demonstrates how this can be realized.

The read amplifier LV2 according to the invention represented in FIG. 2 resembles the read amplifier LV1 of FIG. 1. The sole difference is that an additional transistor switch T9 is interposed into one of the current supply branches of the latch flipflop. All other elements of the read amplifier LV2 which correspond in structure and function to the elements of the read amplifier LV1 in FIG. 1 are provided with the same reference characters and require no further elaboration.

In the read amplifier LV2 in FIG. 2, the additional transistor switch T9 is a P-FET whose source-drain channel lies in series with the transistor switch T5 between the positive supply terminal 11 and the coupled source electrodes of the P-FETs T1, T2 of the latch flipflop T1–T4, and whose gate electrode receives the column selection signal SAS which is also applied to the gate circuit transistors T7, T8. The effect of this is that the additional transistor switch T9 blocks as soon as and as long as the gate circuit T7–T8 is conducting.

Upon the excitation of a word line, the activation of the current supply by way of the transistor switches T5, T6, and the expiration of the evaluation interval, when the latch flipflop T1–T4 has assumed its binary state as specified by the memory information, and the column selection signal SAS appears, the gate circuit T7–T8 becomes conductive, and the latch flipflop is disconnected from the positive supply terminal 11. But the now floating potential at the connection node 10 still holds a sufficiently positive value during a defined period to maintain the potential difference between the data terminals BA, BB to such an extent that the information it represents can be read by way of the conductive gate circuit T7–T8 at the data lines DA, DB in the event of a read operation. On the other hand, the effect of the interruption of the current supply is that the latch flipflop loses its amplification function. It thus becomes easier to throw the latch flipflop T1–T4 over from the data lines DA, DB with the aid of an opposite potential difference in the event of a write operation.

Only when the column selection signal SAS and thus the interruption of the current supply last a relatively long time can the potential difference that must be read in the event of a read operation decay to such an extent that reliable reading is no longer possible. For such cases, in a separate embodiment of the invention, an additional support can be provided for maintaining the potential difference that must be read at the data lines DA, DB. This support can be an additional latch circuit. The outlay for this is bearable if a common data line is used for several read amplifiers, which is usually the case. An exemplary embodiment is shown in the diagram of FIG. 3.

Figure 3:
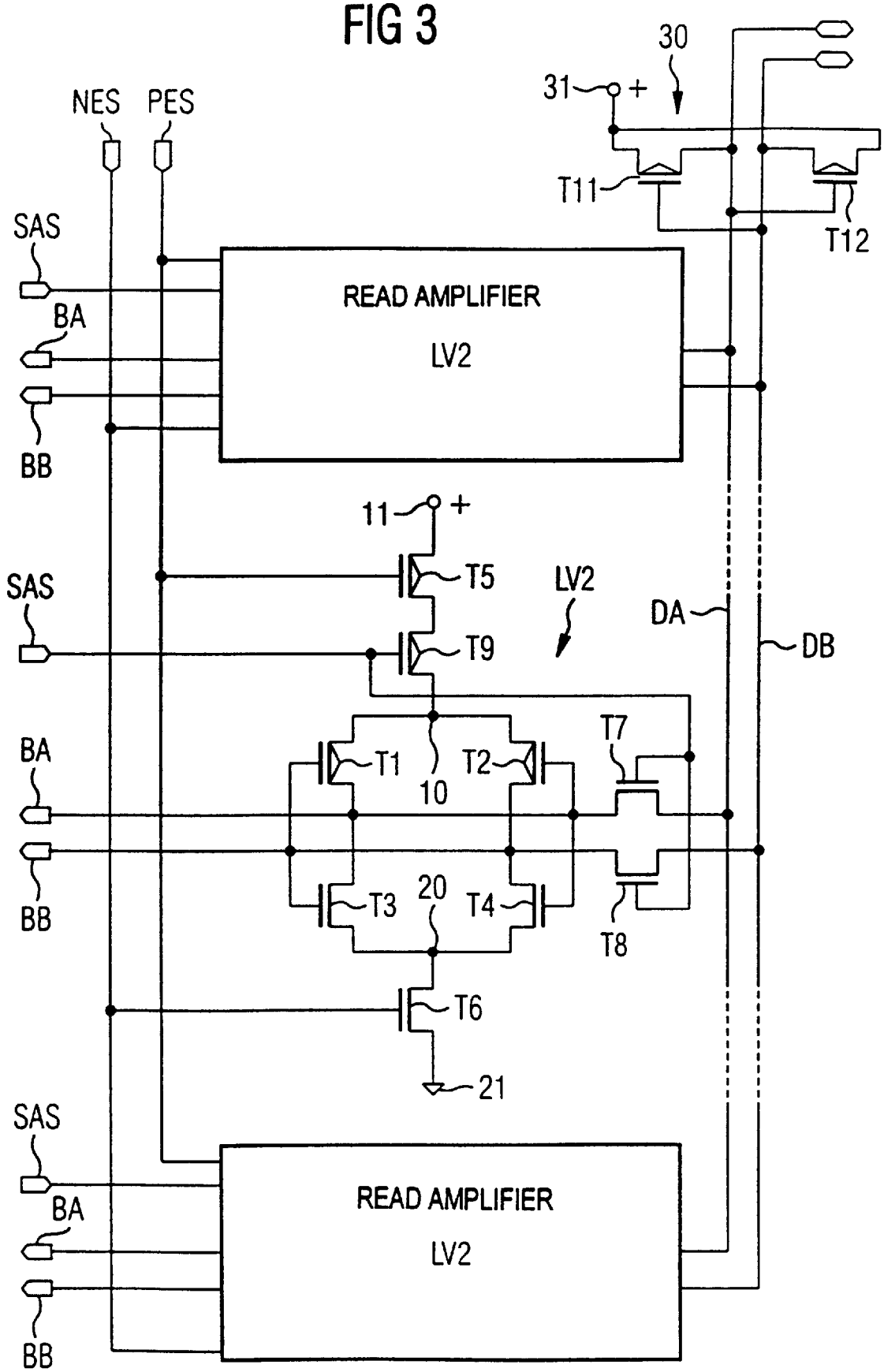
FIG. 3 is a diagram of a circuit configuration containing a plurality of read amplifiers according to the invention with a common auxiliary device.

According to FIG. 3, a number of read amplifiers LV2 of the configuration represented in FIG. 2 are connected to a shared data line pair DA, DB. Only one of these read amplifiers LV2 is represented in detail; the others are symbolized by blocks and have the same construction, with each being connected to a separate bit line pair. The activation signals PES and NES are applied to all read amplifiers jointly. During a read or write cycle, the individual read amplifiers, upon the excitation of a word line and the applying of the activation signals PES and NES, are actuated separately in different time slots by selectively applied column selection signals SAS to read and write information in chronological succession by way of common data line pair DA, DB.

Connected to the data line pair DA, DB, there is a latch circuit containing two transistors T11 and T12, which effectively emulates one half of the latch flipflop of a read amplifier LV2, namely that half which is disconnected from a fixed potential of the supply voltage by the interruption, according to the invention, of the current supply. In the present exemplary embodiment, the transistors T11 and T12 are P-FETs whose source electrodes are coupled together and connected to the positive potential of the supply source, similarly to the transistors T1 and T2 of the latch flipflop of a read amplifier LV2. The drain electrode of the transistor T11 and the gate electrode of the transistor T12 are connected to the data line DA. The drain electrode of the transistor T12 and the gate electrode of the transistor T11 are connected to the data line DB. This wiring corresponds to the wiring of the transistors T1 and T2 with the data terminals BA and BB.

The instant when, in response to a column selection signal SAS, the gate circuit transistors T7, T8 of a read amplifier LV2 become conductive and the positive supply potential is disconnected from the transistors T1 and T2 of the relevant latch flipflop, the transistors T11 and T12 which remain at the positive supply potential take over the previous role of the transistors T1 and T2. The potential difference between the data lines DA and DB which must be read is thus maintained for a reliable read operation.

Besides the configurations described above with reference to FIGS. 2 and 3, which merely represent exemplary embodiments of the invention, modifications and other embodiments for realizing the inventive idea are also possible. Some other holding circuit may also be used as latch circuit 30.

To interrupt the current supply at the read amplifier upon the expiration of the evaluation interval, an interruption control signal which is generated specifically for this purpose can be utilized instead of the column selection signal SAS if so desired. It can be advantageous to start the inventive interruption of the current supply at a delay relative to the leading edge of the column select signal SAS, so that in case of a read operation the information to be read is coupled onto the data lines with greater power. This can be achieved by the corresponding delaying of a separate interruption control signal or by a response delay of the cut-out switch T9. In general, the time of the start of the interruption should not precede the assumption by the relevant latch flipflop of a state indicating the information content of the accessed memory cell and should fall at the latest within the active interval of the relevant column selection signal in order to still have enough time for a write operation during this interval.

The switching device which is utilized to cut off the power supply of the read amplifier can also be disposed at some location other than that which is represented for the transistor T9 in FIG. 2 or FIG. 3, for instance as a cut-out switch in the path of the feeder from reference potential terminal 21 to the latch flipflop T1–T4. In this case, the transistors T11 and T12 of the latch circuit 30 represented in FIG. 3 should be designed as N-FETs and connected to the reference potential with their source electrodes. The switching device can also be constructed or arranged such that it blocks at least one of the existing activation transistors T5, T6, potentially using a suitable switching transistor in the servo loop of these transistors.

It should be noted in conclusion that the invention is limited neither to the specific construction of the read amplifier represented in the fFigures nor to the utilization of paired bit lines and data lines. In the case of "uniline" bit line paths and data line paths, the latch flipflop of the read amplifier has only one data terminal, whose potential relative to a fixed reference potential determines, or rather indicates, the binary state of the flipflop. In that case, the flipflop can be constructed simpler than is represented in the figures. The invention can be successfully applied in any kind of "latching" read amplifiers.

We claim:

1. A circuit configuration for reading and writing binary information at a memory cell field arranged in a matrix of rows and columns of memory cells each connected to a word line allocated to a row and a bit line allocated to a column of the memory cells, comprising:

write/read circuits each connected to access a respective memory cell via a word line and a bit line;

each of said write/read circuits containing a gate circuit controllable by a column selection signal, and a latch flipflop having a current supply and at least one data terminal connected between an allocated bit line and a data line via said gate circuit;

a switching device connected to said current supply of said latch flipflops, said switching device, subsequently to an excitation of any word line, interrupting the current supply to said latch flipflops in the write/read circuits that are controllable by the column selection signal, from an instant no earlier than a time at which the respective latch flipflop assumes a state indicating an information content of the accessed memory cell and, at the latest, within an active interval of the relevant column selection signal.

2. The circuit configuration according to claim 1, wherein said switching device includes a switch in each of said write/read circuits, said switch interrupting a connection between a supply potential and the relevant latch flipflop.

3. The circuit configuration according to claim 2, wherein each said switch responds to the column selection signal of the relevant write/read circuit so as to initiate the interruption of the current supply at a beginning of the column selection signal and to maintain the interruption for the duration of the column selection signal.

4. The circuit configuration according to claim 2, wherein each said latch flipflop includes a first transistor pair with each transistor of said first transistor pair having a control electrode connected to a main electrode of the respective other transistor of said first transistor pair, one of said transistors of said transistor pair has a control electrode connected to a data terminal of said latch flipflop, and the other main electrodes of said first transistor pair are connected to a connection node for receiving a first supply potential, and wherein said switch is disposed between said connection node and a supply terminal carrying the first supply potential of the respective write/read circuit.

5. The circuit configuration according to claim 4, wherein said latch circuit comprises a transistor pair corresponding to said first transistor pair with respect to conductivity type and in which the control electrode of each of said transistor pair is connected to a main electrode of the respective other transistor, the control electrode of one of said transistor pair is connected to a shared data line, which is shared by a plurality of said write/read circuits, and the other main electrodes of said transistor pair are connected to a supply terminal carrying the first supply potential.

6. The circuit configuration according to claim 1, wherein each of the data lines is shared by a plurality of said write/read circuits, and a latch circuit is connected to each data line, the latch circuit locks a binary state of the data terminal of a latch flipflop coupled onto the data line by the allocated gate circuit at the respective data line.

* * * * *